June 23, 1959

G. S. MacDONNELL 2,892,131

PACKAGED ELECTRONIC CIRCUIT

Filed Jan. 18, 1954

INVENTOR:
Gordon S. MacDonnell
BY Hugh L. Mills Jr.

2,892,131

PACKAGED ELECTRONIC CIRCUIT

Gordon S. MacDonnell, Solana Beach, Calif., assignor to Digital Control Systems, Inc., La Jolla, Calif., a corporation of California Application January 18, 1954, Serial No. 404,549

3 Claims. (Cl. 317—101)

The present invention relates to a packaged electronic circuit and, more particularly, to a packaged plug-in electronic circuit unit employing etched circuitry.

In complex electronic systems, for example binary digital computers, having a great redundancy in particular types of electronic circuits, economy in the manufacture, fabrication and servicing of such systems has dictated the use, wherever possible, of mass produced plug-in type of units. Some of the more frequently occurring types of circuits are single or multiple stage amplifiers, flip-flops, cathode followers, and the like, wherein all of the individual circuits within each grouping are substantially identical.

The present invention contemplates a new type of fabrication especially suitable for mass production at an extremely low cost per unit and, at the same time, offers a high degree of miniaturization hence permitting the final system embodying such units to be considerably compacted. For the purposes of illustrating the proposed unit and its construction, a flip-flop design of the type having particular use in binary digital computers has been chosen, it being merely indicative of the novel packaging means employed in accordance with the present invention.

Briefly, the unit comprises a tube socket having circumferentially aligned pin receiving means whose lower ends project outwardly from the cylindrical side portion of the socket. Next, a header unit is employed, it having downwardly projecting pins suitably spaced for insertion into a conventional tube socket with each of the upper ends of the pins projecting outwardly in the fashion of the lower ends of the socket pins. A piece of flexible etched circuitry is next prepared with conductive paths being etched out on one side corresponding to the flip-flop circuitry existing between the header and socket units, with provisions being made for connecting together the various electrical components employed therein as well as connecting them between the projecting pin ends of the socket and header units.

Next, holes are punched out in the etched circuit sheet corresponding to the projecting pin ends of both the socket and header units as well as the component leads. Then, the component leads are inserted from the non-metallic side of the etched sheet into their corresponding punched openings with their lead ends being bent downward or deformed on the etched side of the sheet so as to make both physical and electrical contact with their respective etched circuit portions. After cutting off the excess material of each of the component leads, the etched sheet is rolled around the socket and header unit, the socket being positioned at the top of the sheet and the header unit at the bottom, with each of the projecting pin ends being inserted into its corresponding punched hole in the sheet. The resulting assembly is then dip soldered to secure the components and socket and header unit in place and the resulting assemblage varnished along its outer face to insulate the exposed etched and soldered portions.

The resulting unit has an outside diameter comparable to a conventional tube socket and is of a height only slightly greater than the length of the various resistor and capacitor components contained therein. The resulting unit may be readily plugged into a conventional tube socket having, in turn, such electrical parameters as filament voltage, anode supply voltage, cathode potential, grid supply potential, etc., applied to its pins.

It is, accordingly, the principal object of the present invention to provide a packaged plug-in single tube electronic circuit of an extremely compact design.

Another object of the present invention is to provide a packaged flip-flop unit for receiving a single electronic tube and for insertion into a conventional tube socket, the unit being of an extremely compact design.

A further object of the present invention is to provide a packaged flip-flop unit wherein all conductive couplings are made by a copper pattern on flexible etched circuit sheet, the components being mounted on the etched sheet with the assembly being placed in rolled form between an upper tube socket for receiving the tube of the flip-flop and a lower header unit suitable for insertion into a conventional tube socket.

A still further object of the present invention is to provide a packaged flip-flop unit including a socket unit for receiving an associated vacuum tube and a header unit for insertion into a tube socket, the flip-flop wiring being formed by the copper pattern on a rolled etched circuit sheet positioned between and conductively coupled to the socket and header units, the components of the flip-flop unit being contained within the rolled circuit sheet and conductively coupled to the copper pattern thereon.

Other objects and features of the present invention will be readily apparent to those skilled in the art from the following specification and appended drawings wherein is illustrated a preferred form of the invention, and in which.

Figure 1:
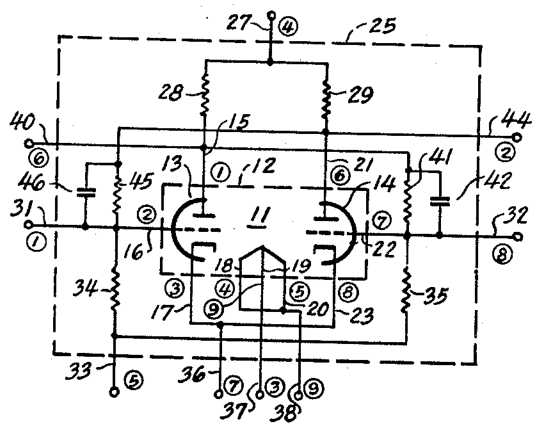
Figure 1 is an electrical circuit diagram of the flip-flop to be packaged in accordance with the present invention.

Referring now to the drawings wherein like elements are given the same numerical designation, there is illustrated in Figure 1 an electrical circuit diagram of a packaged single envelope tube circuit for illustrating the packaging techniques of the present invention, a flip-flop circuit being the one herein specifically set forth by way of example. First, a twin triode tube 11 is illustrated, it being, for example, of a 12AX7, 12AV7, 12AU7, etc., nine prong miniature type and is here shown within a block 12 to more particularly emphasize its input and output pin connections. The first triode section thereof, numbered 13, has its anode connected to an output conductor 15 corresponding, in turn, to pin 1, additionally designated in the drawings by the circled numeral 1, extending from the triode glass envelope. In the same way, the grid electrode of section 13 is shown connected to a conductor 16, conductor 16, in turn, corresponding to pin 2, designated by the circled numeral 2, projecting from the envelope. Further, the cathode of section 13 is connected to a conductor 17, conductor 17 corresponding to pin 3 while the center-tapped heater element is connected to conductors 18, 19 and 20 corresponding, in turn, to pin numbers 4, 9 and 5, respectively. Finally, the anode, grid and cathode of the second triode section 14 are connected to conductors 21, 22, and 23, respectively, which correspond to the envelope pins 6, 7 and 8, respectively.

The above noted triode pin connections correspond to the external electrical circuit connections which must necessarily be made to the tube socket associated with the triode. Now in accordance with the present invention, a flexible etched circuit board with proper components and conductive connections is placed between the tube socket of the type adapted to receive triode 11 and a header unit to be later described in more detail, adapted, in turn, to receive from another tube socket, not here illustrated, the anode and cathode voltage supply potentials of each section, a pair of grid input signals, the filament current, and, finally, supply the pair of flip-flop output signals. Thus, the block in Figure 1 designated 25 shows the pin connections of the header unit with the circuitry between block 25 and block 12 representing the etched circuit conductors and associated circuit components as they, in practice, are connected between the header and triode socket pins.

A conductor 27, representing pin 4 on the header unit, is connected through a first resistor 28 to conductor 15 of triode section 13 and through a resistor 29 to conductor 21 of the other triode section 14. The grid input signal to section 13 is applied on pin 1 of the header unit, as indicated by conductor 31, and from there is applied directly to conductor 16. In the same way, the grid input signal to section 14 is applied to pin 8 of the header unit, here shown as conductor 32 and from there is directly coupled to conductor 22. The grid bias signal for both triode sections is supplied to pin 5 of the header unit, pin 5 being represneted by conductor 33, it being connected through a first resistor 34 to input conductor 16 of section 13 and through a second resistor 35 to conductor 22 of section 14. Pin 7 of the header unit, represented by conductor 36, is connected directly to conductors 17 and 23 to receive the cathode bias potential of both triode sections. Pins 3 and 9 of the header unit, corresponding to conductors 37 and 38, receive the filament voltage and are connected directly to conductor 19 and conductors 18 and 20, respectively. The output signal of section 13 appears on the header pin 6, corresponding to conductor 40, this conductor being coupled directly to anode conductor 15 and through a paralleled resistor 41 and capacitor 42 to grid input conductor 22. Finally, pin 2 of the header, indicated by conductor 44, receives the flip-flop output signal from anode conductor 21 of section 14, this anode being additionally coupled through a paralleled resistor 45 and capacitor 46 to the grid input conductor 16 of section 13.

Figure 2:
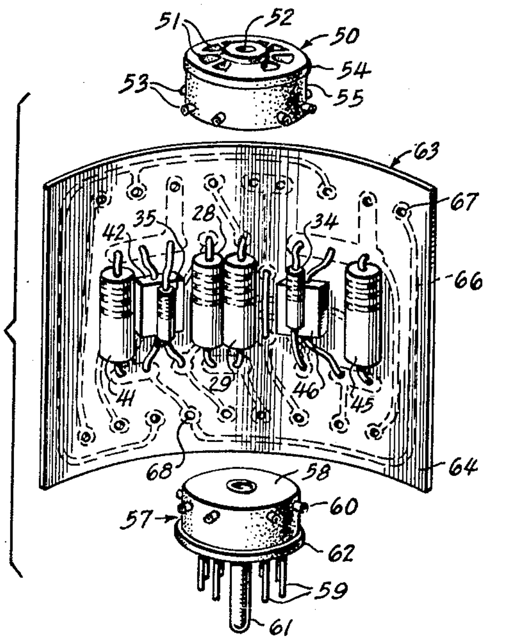
Figure 2 is the packaged flip-flop of the circuit of Figure 1 illustrated in exploded form.

Considering now the mechanization of the Figure 1 circuitry in accordance with the present invention, there is shown in Figure 2 in expanded form, the three basic mechanized elements of the flip-flop. First, the triode tube socket includes a total of nine conductive pin receiving means 51 secured in suitable recesses arranged circumferentially around an opening 52 extending through the socket body portion. The upper ends of these pins receiving are adapted to frictionally engage or grip the pins of an associated vacuum tube, not herein illustrated, in such a way as to both clamp and hence provide mechanical support for the associated glass envelope and electrical contact for the pins. Each of the pin receiving means extends downwardly from its pin gripping portion through a right angle bend with the lower end thereof projecting outwardly from the side of the socket in a horizontal fashion as viewed from Figure 2 for a distance of approximately $\frac{1}{16}$ of an inch. A flange 54 extends around along the top portion of the socket body portion and the difference in diameters between it and the main cylindrical portion 55 forms a slight shoulder, whose depth is preferably equal in dimension to the thickness of the etched circuit base material, to be shortly described.

The details of construction and exact configuration of socket 50 may take wide variations as will be recognized by those skilled in the art. Thus, each of the pin receiving means may be formed of a thin walled tube having a narrow slot at its pin gripping end to afford it proper flexibility and dimensions for securing its associated pin. Then, it may be bent at right angles at a predetermined point along its length to obtain the desired projection distance from without the body portion. With such a configuration for the pin receivers, a preferred manner of completing the socket would be, after these receivers have been positioned properly with respect to one another, to mold the body portion with any suitable plastic.

The second major element of the mechanization is the header unit 57, it comprising a main body section 58 having a plurality of pins 59, nine in number, arranged in a circular fashion around the edge thereof and spaced relative to each other so as to be received by conventional nine-prong tube sockets. Pins 59 extend upwardly and, below the flat top portion of the header unit, are bent outwardly and project horizontally as ends 60 from the circular side portion. These ends 60 may be hollow as were ends 53 of the socket, and preferably project outwardly the same distance from the side of body section 58 as did the ends 53 from the side of socket 50. A flange 62, similar to flange 54, extends around the lower portion of unit 57 and projects approximately the same distance from the main surface of the header unit as does flange 54 from the socket, to thereby form a shoulder of the same dimension. Also included in the header unit is a central header pin 61, of standard size, for insertion into the lock type of tube sockets, it lending mechanical support to the unit when plugged in.

Owing to the extreme similarity in shape between the socket and header units, the same mode of construction suggested above for the socket may here be followed for achieving the header unit. Thus, suitably bent predetermined lengths of tubing or wire along with the central header pin may be secured in proper position with respect with one another, and plastic material molded into the desired body shape around the positioned elements.

Finally, the etched circuit portion 63 is illustrated, it including a flexible etched circuit sheet having the electrical components, previously shown in Figure 1, mounted thereon. Considering first the formation of etched circuit 63, a flexible sheet 64 is utilized, it, preferably consisting of an insulating laminate of, for example, a paper or glass base and impregnated with phenolic or melamine plastic. It may be from .006" to .012" in thickness and originally includes, as is well known in the etched circuit art, a copper coating of, for example, .00135 inch thick on one side thereof. Next a drawing is prepared of the conductive paths between component ends, header ends, tube socket pins, etc., as schematically illustrated in Figure 1, taking into account the physical size of the components to be utilized, the spacings between the various pin ends, and other factors to be later considered. Quite obviously, there exists an extremely large number of possible suitable tracings corresponding to the circuitry of Figure 1, only one of which is herewith presented for illustration purposes.

After completion of this drawing, a photographic negative is prepared and, after coating the copper surface with an acid resistant light sensitive emulsion, a light of strong intensity is projected through the negative on the emulsion. Then the emulsion is developed in accordance with conventional etched circuit art with the result that the emulsion over-lapping the unexposed portions of the surface may be washed away. Then, the unprotected copper areas, that is, those areas corresponding to the removed emulsion, are then etched away in an acid or electro-etching bath and only the conductive areas, as originally drawn, will remain as copper on the surface of the laminate. In this illustration, these copper areas are shown as dotted lines on Figure 2 since they appear on the reverse side of sheet 64.

In preparing the initial drawing, circular areas should be placed at those points where the ends of the socket and header unit pins and the component lead ends are to make engagement with the conductive copper portion of the laminate. These areas should be of greater dimension than their respective leads for reasons to be apparent later. Considering now, for the moment, one circuit connection on the etched sheet by way of example, a conductive path 66 extends between an upper right circular copper area 67 and another circular copper area 68, area 68 being the sixth one from the right on the bottom row of terminals. As will later be understood, area 67 corresponds to pin 1 of the upper socket, it, in turn, corresponding to conductor 15 of Figure 1, or the anode of triode section 13. On the other hand, copper area 68 corresponds to pin 6 of the header which, as stated previously, contains the output signal appearing on conductor 40 in Figure 1. Thus, conductive path 66 acts directly to connect the pin corresponding to the anode of triode 11 to the pin of header 51 corresponding to the output signal appearing thereon. Although the remaining conductive paths and associated physically illustrated components in Figure 2 are not herein described in detail to show their obvious correspondence with the schematic circuit of Figure 1, it is apparent that such could be done and that the layout of Figure 2 is the mechanization of the circuit diagram of Figure 1.

In the event the various copper paths cannot be initially laid out without crossovers, then jumpers may be used to connect spaced copper areas lying between opposite sides of a pathway, each jumper being treated in the manner described for a component. In the present embodiment, one such conductive jumper is required, it being located directly between resistor 29 and capacitor 46 as viewed from Figure 2.

After the etching process has been completed, a hole is punched in each copper area corresponding to a header or socket pin end, each adjacent pair of holes being accurately spaced corresponding to the circumferential distance extending between their associated pin ends. Then, holes are punched or formed within the etched pattern, their physical placements corresponding to the lead placements of the resistor and capacitor components when maintained in desired position. Next, the various components are brought toward sheet 63 from its unetched or backside with their leads being inserted through their corresponding openings in the etched sheet. These lead ends may then be bent over, swaged or crimped to make positive engagement with the etched portion of the circuitry. Next, the excess lead portions are removed, as by cutting, leaving the components attached to the sheet with sufficient rigidity that the ensuing unit may be manipulated without fear of disarranging the various parts thereon.

Figure 3:
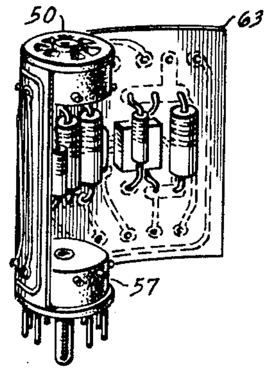
Figure 3 illustrates the manner of joining the principal elements of Figure 2.

After completion of the above noted steps, the protruding ends of the header and socket unit pins are inserted into their corresponding openings punched in the lower and upper rows of copper areas. This is most readily done by beginning at one edge of the sheet, inserting the first longitudinally aligned pin ends into the first longitudinally aligned punched openings in the top and bottom rows of areas and then proceeding by rolling the sheet around the two units, inserting, by pairs, the pins into their corresponding openings during the process. The view in Figure 3 reveals this process when about one-half complete.

It should here be noted that the rows of punched openings formed along both the top and bottom edges of sheet 63 are spaced from their respective edges an amount corresponding to the distance from the pin ends 53 and 60 and the shoulders on socket and header units 50 and 57, respectively. This permits, as observable in Figures 3 and 4, a snug fit between the two laminate edges and the shoulder portions. Also, by having the shoulder depths correspond to the thickness of laminate used, as before mentioned, a relatively smooth outer surface is obtained throughout the height of the completed unit.

Figure 4:
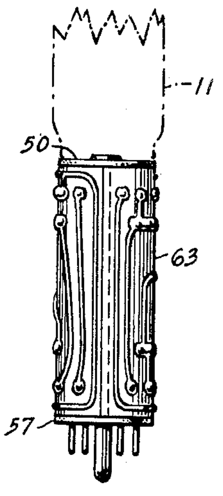
Figure 4 illustrates the final packaged flip-flop unit.

The length of etched sheet 63 relative to the circumference of the outer surface of both header and socket units is preferably such as to cause a small amount of overlap, for example ⅛ to $\frac{1}{16}$ of an inch to occur after completion of this assembly process, the overlap being indicated by the dotted line adjacent to the edge of the assembled unit as shown in Figure 4. This overlap portion may, if necessary before proceeding to the next step, be secured by varnish or other adhesives.

The next step in completing the assembly process is to place a cap or plastic tube over the exposed end portion and dip solder the entire assembly, such that all of the compenent ends protruding through their corresponding openings in the laminate are securely soldered to their corresponding etched circuit portions. Then, the resulting assembly may be sprayed with an insulating agent or dipped within a variety of suitable plastic insulating materials and the cap protecting the end removed. Upon completion of this step, the unit is then ready for receiving the vacuum tube and testing.

As an additional step, the finished unit may be further insulated by sliding a hollow plastic tube, not here illustrated, over the outer etched circuit face of the laminate, the inside diameter of the tube roughly equaling or barely exceeding the maximum diameter of the coiled laminate. This tube may also have an outer metallic surface which may, when grounded, provide shielding for the circuit enclosed therein. To provide a stop for the tube, another shoulder may be provided, either in the socket if the tube is to be slid upward from the header unit or in the header if the tube is to be slid downward from the socket.

As will be readily apparent to those skilled in the art, the present invention is concerned primarily with circuit packaging or mechanizing techniques and not in the particular flip-flop circuit herein illustrated. For example, single stage amplifiers, two stage amplifiers, oscillators, etc. could well be constructed in accordance with the practices herein set forth. Also, the present invention is obviously not limited to nine prong or miniature tubes or header units. Thus, octal or other numbered tube sockets could be employed while the socket and header units may have different numbers of pins rather than the same number as is here illustrated.

The completed unit, as may readily be seen from Figure 4, is of an extremely compact form, it being no larger in diameter than the tube socket and being only slightly longer than the length of the various resistor and capacitor components enclosed therein. This compactness permits an extremely high degree of efficiency in stacking such components in any final system. In addition, sufficient rigidity is accomplished through the soldering and varnishing processes to permit operation under extreme shock conditions. Servicing a system employing a number of such units is readily accomplished through the usual plug-in techniques, namely, inserting known operable units for possible defective ones and observing the system's operations. Also, it will be appreciated that an electronic unit according to the present invention may be mass produced at an extremely low cost owing to the etched circuitry and simplicity of the steps involved.

What is claimed is:

1. A packaged electronic circuit comprising: a tube socket including a cylindrical body portion and a plurality of spaced circumferentially aligned pin receiving means embedded therein, each of said pin receiving means including an upper end portion for receiving a prong of an associated vacuum tube and a lower end portion projecting outwardly from the cylindrical surface of said body portion; a header unit including a cylindrical body portion and a plurality of circumferentially aligned pins embedded therein, the upper end of each of said pins projecting outwardly from the cylindrical surface of said body portion, the lower ends of said pins projecting downwardly from said body portion; a plurality of components, each of said components having a pair of conductive leads; an etched circuit sheet having an etched copper pattern on one side, said copper pattern including the electrical connections between the component leads, the lower ends of the socket unit pin receiving means and the upper ends of the header unit pins, said etched circuit sheet including a series of openings intercepting said copper portion at points corresponding to the placement of the component leads, the header unit upper pin ends, and the lower ends of said socket unit pin receiving means; means for conductively securing the component leads to their corresponding points on said copper pattern, said components being positioned on the unetched side of said etched circuit sheet with said leads passing through their corresponding openings to said pattern; and means for conductively securing the upper pin ends of said header unit and the lower ends of the socket unit pin receiving means to their corresponding points on said copper pattern, said upper pin ends of the header unit and said lower ends of the socket unit pin receiving means passing through their corresponding openings at said corresponding points, whereby a complete packaged electronic circuit is formed.

2. The packaged electronic circuit of claim 1 wherein the openings in said etched circuit sheet corresponding to the lower ends of said socket unit pin receiving means lie in alignment along its upper edge and the openings corresponding to the upper pin ends of said header unit lie along its lower edge, with the etched circuit sheet being positioned in rolled fashion around the cylindrical surfaces of said header and socket units to thereby form a cylindrically shaped packaged circuit.

3. The method of forming a packaged electronic unit to correspond to a circuit diagram from flexible insulating sheet having a thin copper backing on one side, a plurality of components each including a pair of leads, a socket unit having a cylindrical body portion and a plurality of circumferentially aligned pin receiving means embedded in said body portion, each of said pin receiving means having its lower end projecting outwardly from the cylindrical surface of the body portion, and a header unit having a cylindrical body portion and a plurality of circumferentially aligned pins embedded in said body portion, the upper end of each of said pins projecting outwardly from the cylindrical surface of said body portion, said method comprising the steps of: etching away a portion of the copper surface on said insulating sheet leaving a copper pattern corresponding to the conductive connections between the component leads, the lower ends of said pin receiving means and the upper ends of said header unit pins in accordance with the electrical circuit diagram; forming a series of openings in said insulating sheet through said copper pattern at points corresponding to the placement of the leads of said plurality of components, forming a plurality of openings along the upper edge of said insulating sheet through said copper pattern, said openings being longitudinally spaced corresponding to the arcuate distance between the lower ends of said pin receiving means measured along the surface of said socket unit body portion; forming a plurality of openings along the lower edge of said insulating sheet and spaced corresponding to the arcuate distance between the upper ends of said header unit pins measured along the surface of said header unit body portion; inserting said component leads through their corresponding openings in said insulating sheet such that their respective leads lie adjacent the conductive pattern, said components being positioned adjacent the other side of said flexible sheet; deforming the leads adjacent the copper pattern to secure said components in place; inserting the lower ends of said pin receiving means and the upper ends of said header unit pins in their corresponding openings in said insulating sheet whereby a cylindrical assembly is formed; dip soldering the assembly to conductively couple the component leads and header and socket units to the copper pattern adjacent the openings; and applying insulating material to the outer surface of the assembly.

References Cited in the file of this patent

UNITED STATES PATENTS

| | | |
|---|---|---|
| 2,441,960 | Eisler | May 25, 1948 |
| 2,637,763 | Palmer | May 5, 1953 |
| 2,668,933 | Shapiro | Feb. 9, 1954 |
| 2,682,018 | Phillips | June 2, 1954 |
| 2,703,853 | Chrystie | Mar. 8, 1955 |
| 2,764,713 | Alden | Sept. 25, 1956 |

FOREIGN PATENTS

| | | |
|---|---|---|
| 635,947 | Great Britain | Apr. 19, 1950 |

OTHER REFERENCES

"Printed Circuit Techniques," National Bureau of Standards Circular 468, issued Nov. 15, 1947.

"New Advances in Printed Circuits," National Bureau of Standards Publication 192, issued Nov. 22, 1948.